(12) United States Patent
Liu et al.

(10) Patent No.: US 8,357,646 B2
(45) Date of Patent: Jan. 22, 2013

(54) STRIPPER FOR DRY FILM REMOVAL

(75) Inventors: Wen Dar Liu, Chupei (TW); Yi Chia Lee, Danshu (TW); Archie Liao, Taipei (TW); Madhukar Bhaskara Rao, Fogelsville, PA (US); Matthew I. Egbe, West Norriton, PA (US); Chimin Sheu, Taipei (TW); Michael Walter Legenza, Bellingham, MA (US)

(73) Assignee: Air Products and Chemicals, Inc., Allentown, PA (US)

( * ) Notice: Subject to any disclaimer, the term of this patent is extended or adjusted under 35 U.S.C. 154(b) by 518 days.

(21) Appl. No.: 12/394,183

(22) Filed: Feb. 27, 2009

(65) Prior Publication Data

US 2009/0227483 A1     Sep. 10, 2009

Related U.S. Application Data

(60) Provisional application No. 61/034,592, filed on Mar. 7, 2008.

(51) Int. Cl.
*B08B 3/00* (2006.01)

(52) U.S. Cl. ............................. 510/175; 134/1.3; 134/34

(58) Field of Classification Search .................. 510/175; 134/1.3, 34
See application file for complete search history.

(56) References Cited

U.S. PATENT DOCUMENTS

| | | | |
|---|---|---|---|
| 5,688,411 A | 11/1997 | Kutsuzawa et al. | |
| 6,225,034 B1 | 5/2001 | Tanabe et al. | |
| 6,951,710 B2 | 10/2005 | Rieker et al. | |
| 7,700,533 B2 | 4/2010 | Egbe et al. | |
| 7,959,767 B2 | 6/2011 | Lallier et al. | |
| 2003/0181344 A1 | 9/2003 | Ikemoto et al. | |
| 2004/0137379 A1 | 7/2004 | Ikemoto | |
| 2005/0263743 A1 | 12/2005 | Lee | |
| 2006/0003910 A1* | 1/2006 | Hsu et al. ...................... | 510/176 |
| 2006/0014656 A1 | 1/2006 | Egbe et al. | |
| 2006/0016785 A1 | 1/2006 | Egbe et al. | |
| 2006/0094613 A1 | 5/2006 | Lee | |
| 2006/0115970 A1 | 6/2006 | Lee | |
| 2007/0078072 A1 | 4/2007 | Yokoi et al. | |
| 2007/0149430 A1* | 6/2007 | Egbe et al. ...................... | 510/175 |
| 2009/0111726 A1* | 4/2009 | Shang .......................... | 510/176 |

FOREIGN PATENT DOCUMENTS

| | | |
|---|---|---|
| CN | 1715389 A | 1/2006 |
| EP | 1 736 534 A1 | 12/2006 |
| EP | 1808480 A1 | 7/2007 |
| EP | 2 098 911 A2 | 9/2009 |
| JP | 9-269601 A2 | 10/1997 |
| JP | 11-119444 A2 | 10/1997 |
| JP | 11-282176 A2 | 3/1998 |
| JP | 2003-228179 A2 | 1/2002 |

(Continued)

*Primary Examiner* — Gregory Webb
(74) *Attorney, Agent, or Firm* — Lina Yang

(57) ABSTRACT

The present invention, in a preferred embodiment, is a photoresist stripper formulation, comprising: Hydroxylamine ; Water; a solvent selected from the group consisting of dimethylsulfoxide; N-methylpyrrrolidine; dimethylacetamide; dipropylene glycol monomethyl ether; monoethanolamine and mixtures thereof; a base selected from the group consisting of choline hydroxide, monoethanolamine, tetramethylammonium hydroxide; aminoethylethanolamine and mixtures thereof; a metal corrosion inhibitor selected from the group consisting of catechol, gallic acid, lactic acid, benzotriazole and mixtures thereof; and a bath life extending agent selected from the group consisting of glycerine, propylene glycol and mixtures thereof. The present invention is also a method for using formulations as exemplified in the preferred embodiment.

10 Claims, 3 Drawing Sheets

Before

After

FOREIGN PATENT DOCUMENTS

| | | |
|---|---|---|
| JP | 2006-317714 A2 | 5/2005 |
| JP | 2006-009006 A2 | 6/2005 |
| JP | 2006-096984 A2 | 7/2005 |
| JP | 2007-016232 A2 | 6/2006 |
| JP | 2008-007660 A2 | 6/2006 |
| JP | 2007-188080 A | 7/2007 |
| JP | 2007-531902 A | 11/2007 |
| JP | 2010-518192 A | 5/2010 |
| KR | 10-742119 | 7/2007 |
| WO | 03/091376 A1 | 11/2003 |
| WO | 03091376 A1 | 11/2003 |

* cited by examiner

STRIPPER FOR DRY FILM REMOVAL

CROSS-REFERENCE TO RELATED APPLICATIONS

This Application claims the benefit of Provisional Application No. 61/034,592, filed on Mar. 7, 2008.

BACKGROUND OF THE INVENTION

In the manufacture of semiconductor circuits on wafers, the wafers are periodically coated with photoresist to fabricate the various layers of circuitry, electrical devices and vias and interconnects. After photoresist is developed and used, etching and ashing are performed resulting in residues that must be removed before further processing. Strippers have been utilized to remove unwanted photoresist and the residues of etching and ashing. The photoresist, etch residue or ash residue is difficult to selectively remove without damaging the desired circuit structures. The stripper must be compatible with dielectric and metal conductive materials. The corrosion rate of either of these differing types of materials must be within acceptable levels.

Commercially available strippers for the application of thick dry film (usually range from 70 to 120 micrometer (micron (μm))) removal comprise a mixture of dimethylsulfoxide (DMSO) and tetramethylammonium hydroxide (TMAH). These strippers usually operate at elevated temp (>90° C.) and suffer from short bath-life issues. Strippers in this field are described in U.S. 2005/0263743, U.S. 2006/0094613 and U.S. 2006/0115970.

BRIEF SUMMARY OF THE INVENTION

The present invention is a photoresist stripper formulation for removing photoresist, etch residue or ash residue from a semiconductor device surface, comprising
  Hydroxylamine;
  Water;
  A solvent selected from the group consisting of dimethylsulfoxide; N-methylpyrrrolidine; dimethylacetamide; dipropylene glycol monomethyl ether; monoethanolamine and mixtures thereof;
  A base selected from the group consisting of choline hydroxide, monoethanolamine, tetramethylammonium hydroxide; aminoethylethanolamine and mixtures thereof;
  A metal corrosion inhibitor selected from the group consisting of catechol, gallic acid, lactic acid, benzotriazole and mixtures thereof; and
  A bath life extending agent selected from the group consisting of glycerine, propylene glycol and mixtures thereof.

The present invention is also a method of stripping photoresist, etch residue or ash residue using the above formulation.

DETAILED DESCRIPTION OF THE INVENTION

Photoresist stripper formulations have been used in this field, but currently these formulations suffer from high copper conductor etch rates and shorter photoresist stripper active bath-life and undesirable operating temperatures.

A new photoresist stripper was developed for the application of dry film removal in the present invention. In order to improve such issue, a series of tests were performed and several key components were found strongly related to dry film removal and copper protection. Compared with commercial strippers used for dry film cleaning, this stripper can be used under milder conditions (preferably 60° C. for 30 minutes) and has comparable cleaning performance and copper conductive line etch rate. Furthermore, the active bath-life is significantly improved in the present invention.

The formulation in the present invention has some distinct features:
1. The stripper of the present invention shows good cleanability of the dry film at 60° C. for 30 minutes without agitation;
2. Cross-section of the substrate processed with the present stripper, checked by Scanning Electron Microscopy (SEM), also shows copper loss is less than 10% within the 75 hours test period;
3. Bath-life of the stripper of the present invention is higher than 75 hours at 60°C.

WORKING EXAMPLES

In the working examples, the following abbreviations have been used:
TMAH=tetramethylammonium hydroxide;
DMSO=dimethylsulfoxide;
HA=hydroxylamine;
NMP=N-methylpyrrrolidine;
DMAC=dimethylacetamide;
DPM=dipropylene glycol monomethyl ether;
MEA=monoethanolamine;
AEEA=aminoethylethanolamine;
DIW=deionized water;
BZT=benzotriazole.

Example 1

The present photoresist stripper formulation was prepared in accordance with Table 1, below.

TABLE 1

| Addition Order | Raw Material-Pilot Plant | Wt. Pct | 500 g scale | Max. temp (° C.) |
|---|---|---|---|---|
| 1 | Water | 5.72% | 28.6 | 24 |
| 2 | TMAH (25% solution) | 22.87% | 114.35 | 24 |
| 3 | DMSO | 57.18% | 285.9 | 37 |
| 4 | HA (50%) | 8.26% | 41.3 | 39 |
| 5 | Glycerine | 5.40% | 27 | 37 |
| 6 | Catechol | 0.57% | 2.85 | 37 |

An embodiment of the resulting photoresist stripper formulation of the present invention has a compositional makeup as set forth in Table 2, showing preferred ranges of compositional content for a preferred embodiment.

TABLE 2

| Component | Preferred Embodiment | Range |
|---|---|---|
| DMSO | 57.18 | 10% |
| TMAH (25%) | 22.87 | 10% |
| HA (50%) | 8.26 | 10% |
| DIW | 5.72 | 10% |
| Glycerine | 5.40 | 10% |
| Catechol | 0.57 | 5% |
| Total | 100.00 | |

Figure 1:
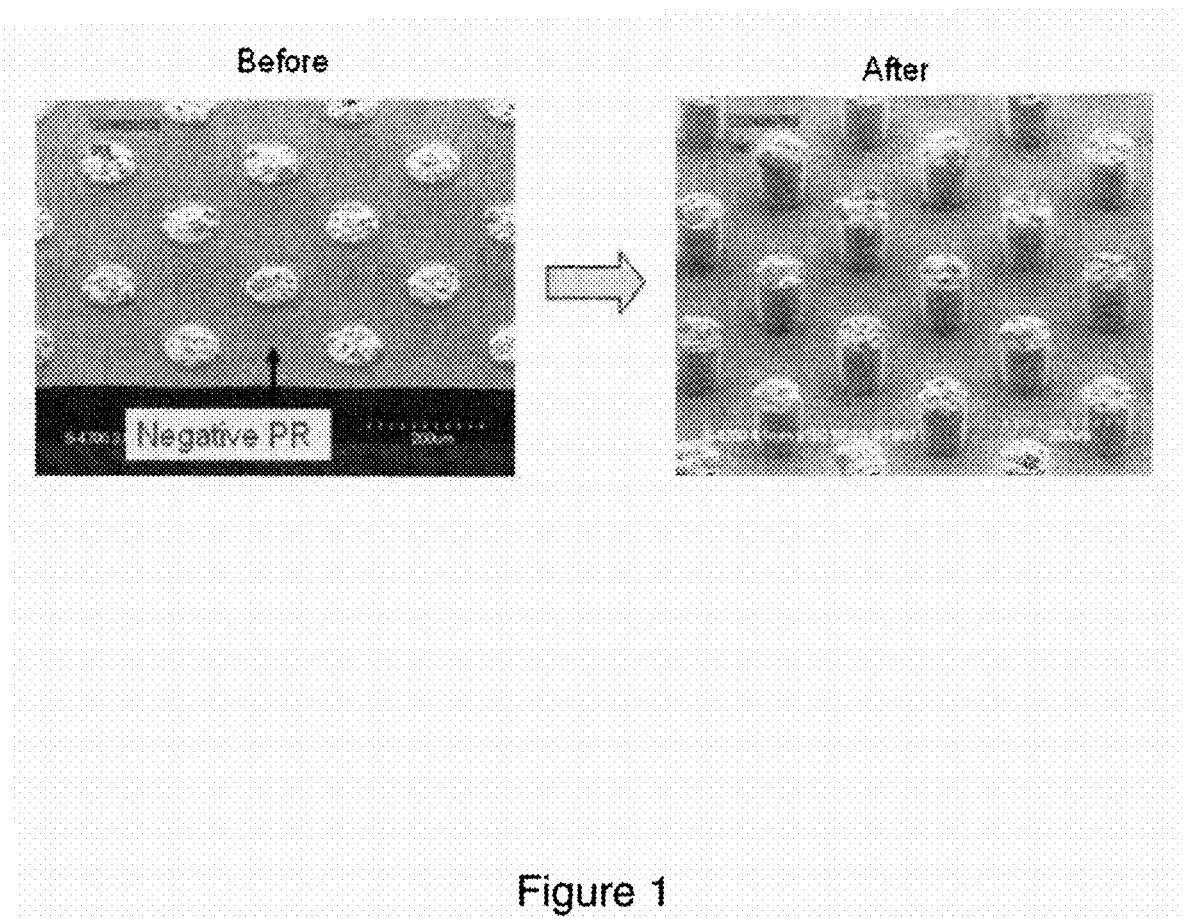
FIG. 1 are the Scanning Electron Microscopy (SEM) images showing the cleaning performance using the formulation in Table 2.

The preferred embodiment of Table 2 was tested on a discretely patterned film on a substrate (a dry film) under process conditions of 60° C. for 30 minutes. The excellent cleaning performance was clearly shown from the SEM scanning images shown in FIG. 1.

Variations in the photoresist formulations of the present invention are contemplated and including, but are not limited to the analogs listed in Table 3, below.

TABLE 3

| Composition | Analogs |
|---|---|
| DMSO | NMP, DMAC, DPM, MEA, etc. |
| TMAH (25%) | Choline hydroxide, MEA, AEEA, etc. |
| HA (50%) | |
| DIW | |
| Glycerine | propylene glycol |
| Catechol | Gallic acid, Lactic acid, BZT, etc. |

Example 2

The preferred embodiment of Table 2 was tested on a copper film on a substrate under a process condition of 60° C. and for the time intervals shown in Table 4, below.

TABLE 4

| Time | Copper Etch in Angstroms |
|---|---|
| Control | 4830 |
| 0 Hours | 4440 |
| 20 Hours | 4617 |
| 27 Hours | 4611 |
| 45 Hours | 4782 |
| 75 Hours | 4440 |

The Cu loss was checked by Scanning Electron Microscopy (SEM). The SEM data was shown in FIG. 2.

Figure 2:
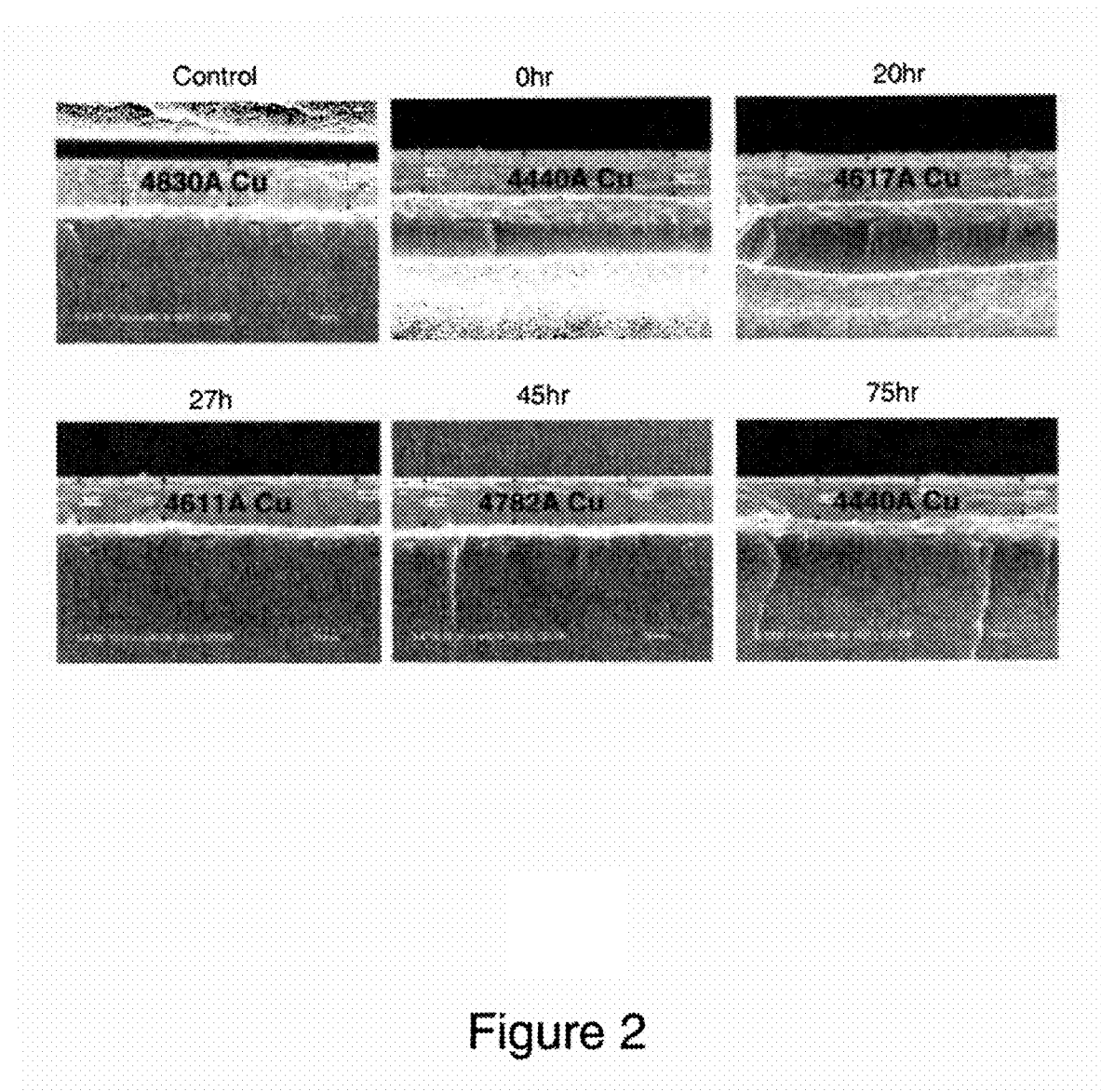
FIG. 2 are the Scanning Electron Microscopy (SEM) images showing the copper loss within the 75 hours test period, when the formulation in Table 2 is used.

The data both in FIG. 2 and in Table 4 demonstrates that this embodiment of the stripper formulation of the present invention shows acceptable levels of copper etch over a wide range of time of exposure. The copper loss was less than 10% within the 75 hours test period.

Example 3

Figure 3:
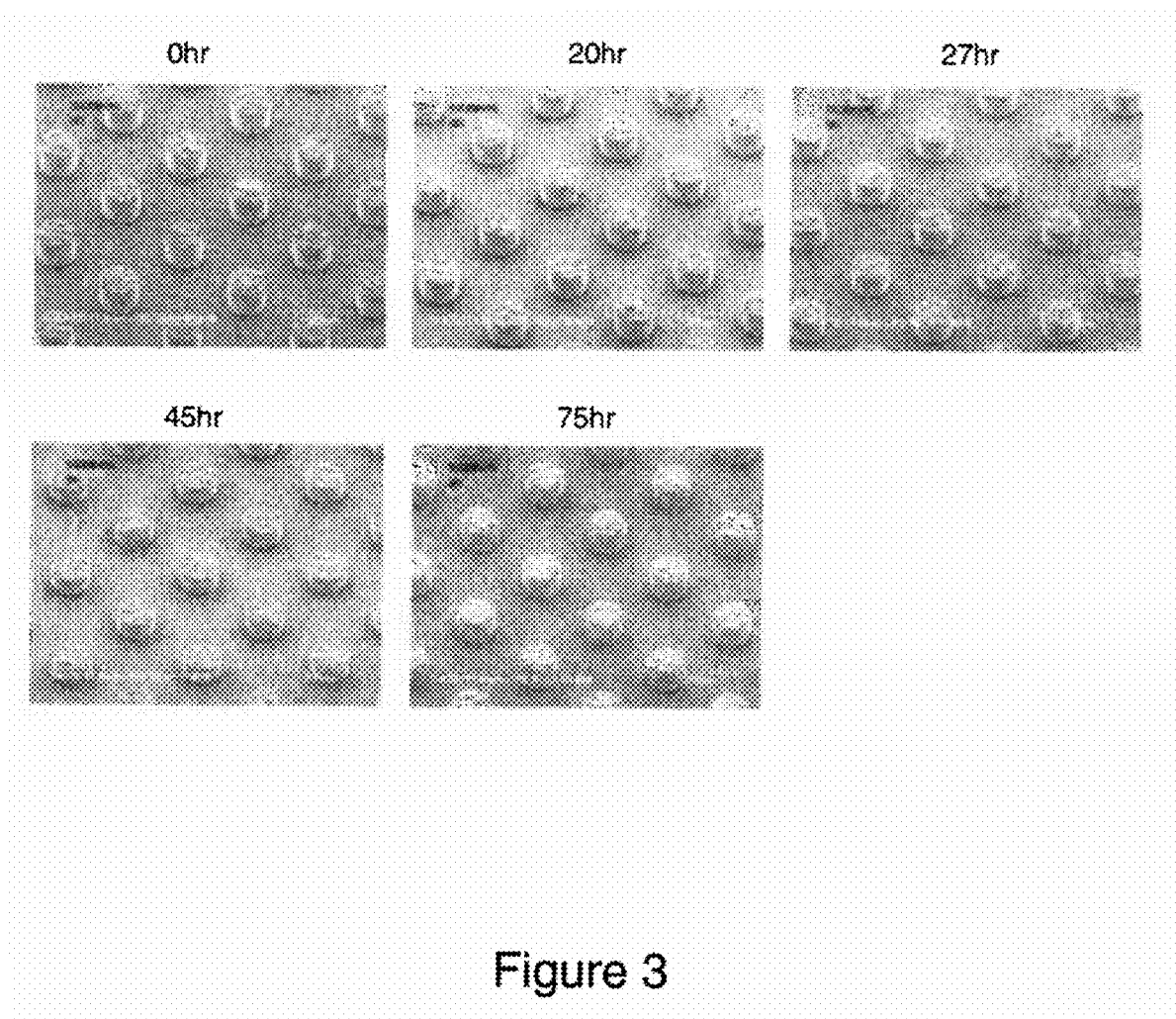
FIG. 3 are the Scanning Electron Microscopy (SEM) images showing the active bath life over the 75 hours test period, when the formulation in Table 2 is used.

The preferred embodiment of Table 2 was tested on a discretely patterned film on a substrate under process conditions of 60° C. and for the time intervals of 20 hours, 27 Hours, 45 Hours, and 75 Hours. The SEM images were shown in FIG. 3. Table 5 below shows the visual determination of effective bath life based upon removal of film from patterned geometry from the images.

TABLE 5

| Time | High Definition* | Medium Definition* | Low Definition* |
|---|---|---|---|
| 0 Hours | X | | |
| 20 Hours | X | | |
| 27 Hours | X | | |
| 45 Hours | | X | |
| 75 Hours | | X | |

*"Definition" = preservation of a desired geometry on a wafer while removal by the stripper of undesired surrounding materials, with sharp angles and shapes retained.

The results in Table 5 show that the active bath life of the stripper of the present invention as exemplified by the embodiment of Table 2 has effective stripping ability over the span of 75 hours.

Additional examples of the base include benzyltrimethylammonium hydroxide, dimethyldiethylammonium hydroxide, ethytrimethylammonium hydroxide, methytriethylammonium hydroxide, tetrabutyammonium hydroxide tetraethylammonium hydroxide, tetrapropylammonium hydroxide and ammonium hydroxide with analogous organic groups replacing hydrogen on the ammonium group, such as alkyl and aryl groups including various combinations of methyl, ethyl, propyl, butyl, pentyl, and hexyl.

The working examples have shown that a new photoresist stripper was developed for the application of dry film removal. Several key components were found strongly related to dry film removal and copper protection. Hydroxylamine in the stripping formulation reacts with dry film and increases the solubility allowing significantly reduced process temperatures, typically down to 60° C.; glycerine and/or glycerol slows down DIW evaporizing speed and prolongs the bath-life; and catechol prevents copper corrosion.

The stripping formulations have demonstrated stripping effect on a discretely patterned film on a substrate (a dry film) in the working examples. However, it should be understood that the stripping formulations can be used to remove photoresist, and residues left from etching and ashing processes from any semiconductor device surface.

While specific embodiments have been described in details, those with ordinary skill in the art will appreciate that various modifications and alternatives to those details could be developed in light of the overall teaching of the disclosure. Accordingly, the particular embodiments disclosed are meant to be illustrative only and not limitings to the scope of the invention, which is to be given the full breath of the appended claims and any all equivalents thereof.

The invention claimed is:

1. A photoresist stripper formulation for removing photoresist, etch residue or ash residue from a semiconductor device surface, consisting of
    Hydroxylamine ranging from 2.5 to 5.0 wt %;
    Water ranging from 5 to 10 wt %;
    A solvent ranging from 40 to 70 wt %, selected from the group consisting of dimethylsulfoxide; N-methylpyrrolidine; dimethylacetamide; dipropylene glycol monomethyl ether; monoethanolamine and mixtures thereof;
    A base ranging from 5 to 7.5 wt %, selected from the group consisting of choline hydroxide, monoethanolamine, tetramethylammonium hydroxide; aminoethylethanolamine and mixtures thereof;
    A metal corrosion inhibitor ranging from 0.25 to 1.0 wt %, selected from the group consisting of catechol, gallic acid, lactic acid, benzotriazole and mixtures thereof; and
    A bath life extending agent glycerine, ranging from 2.0 to 10 wt %.

2. The photoresist stripper formulation of claim 1, consisting of
- Hydroxylamine (50% aqueous solution) ranges from 5 to 10 wt %;
- Water ranges from 5 to 10 wt %;
- Dimethylsulfoxide ranges from 40 to 70 wt %;
- Tetramethylammonium hydroxide (25% aqueous solution) ranges from 20 to 30 wt %;
- Catechol ranges from 0.25 to 1.0 wt %; and,
- Glycerine ranges from 2 to 10 wt %.

3. The photoresist stripper formulation of claim 2, consisting of
- Hydroxylamine (50% aqueous solution) 8.26 wt %;
- Water 5.72 wt %;
- Dimethylsulfoxide 57.18 wt %;
- Tetramethylammonium hydroxide (25% aqueous solution) 22.87 wt %;
- Catechol 0.57 wt % and
- Glycerine 5.4 wt %.

4. A method for removing photoresist, etch residue or ash residue from a semiconductor device surface, comprising contacting the photoresist, etch residue or ash residue with a photoresist stripper formulation, consisting of
- Hydroxylamine ranging from 2.5 to 5.0 wt %;
- Water ranging from 5 to 10 wt %;;
- A solvent ranging from 40 to 70 wt %, selected from the group consisting of dimethylsulfoxide; N-methylpyrrolidine; dimethylacetamide; dipropylene glycol monomethyl ether; monoethanolamine and mixtures thereof;
- A base ranging from 5 to 7.5 wt %, selected from the group consisting of choline hydroxide, monoethanolamine, tetramethylammonium hydroxide; aminoethylethanolamine and mixtures thereof;
- A metal corrosion inhibitor ranging from 0.25 to 1.0 wt %, selected from the group consisting of catechol, gallic acid, lactic acid, benzotriazole and mixtures thereof; and
- A bath life extending agent glycerine, ranging from 2.0 to 10 wt %.

5. The method of Claim 4 wherein the photoresist stripper formulation consisting of Hydroxylamine (50% aqueous solution) ranges from 5 to 10 wt %;
- Water ranges from 5 to 10 wt %;
- Dimethylsulfoxide ranges from 40 to 70 wt %;
- Tetramethylammonium hydroxide (25% aqueous solution) ranges from 20 to 30 wt %;
- Catechol ranges from 0.25 to 1.0 wt %; and,
- Glycerine ranges from 2 to 10 wt %.

6. The method of claim 5 wherein the photoresist stripper formulation consisting of
- Hydroxylamine (50% aqueous solution) 8.26 wt %;
- Water 5.72 wt %;
- Dimethylsulfoxide 57.18 wt %;
- Tetramethylammonium hydroxide (25% aqueous solution) 22.87 wt %;
- Catechol 0.57 wt % and
- Glycerine 5.4 wt %.

7. The method of claim 4 wherein the photoresist, etch residue or ash residue is contacted with the formulation at a temperature below 70° C.

8. The method of claim 7 wherein the temperature is 60° C.

9. The method of claim 4 wherein photoresist, etch residue or ash residue is contacted with the formulation for a time of less than 60 minutes.

10. The method of claim 9 wherein photoresist, etch residue or ash residue is contacted with the formulation for a time of no more than 30 minutes.

\* \* \* \* \*